(12) United States Patent  
Miura (10) Patent No.: US 11,913,115 B2  
(45) Date of Patent: Feb. 27, 2024

(54) SUBSTRATE PROCESSING APPARATUS AND SUBSTRATE PROCESSING METHOD

(71) Applicant: Tokyo Electron Limited, Tokyo (JP)

(72) Inventor: Yoshitaka Miura, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 594 days.

(21) Appl. No.: 16/928,740

(22) Filed: Jul. 14, 2020

(65) Prior Publication Data

US 2021/0017646 A1 Jan. 21, 2021

(30) Foreign Application Priority Data

Jul. 17, 2019 (JP) .................................. 2019-132099

(51) Int. Cl.
| | |
|---|---|
| *C23C 16/52* | (2006.01) |
| *C23C 16/455* | (2006.01) |
| *C23C 16/458* | (2006.01) |
| C23C 16/44 | (2006.01) |

(52) U.S. Cl.
CPC .... *C23C 16/4588* (2013.01); *C23C 16/45544* (2013.01); *C23C 16/45561* (2013.01); *C23C 16/45578* (2013.01); *C23C 16/52* (2013.01); *C23C 16/4401* (2013.01); *C23C 16/45589* (2013.01)

(58) Field of Classification Search
CPC .......... C23C 16/4588; C23C 16/45544; C23C 16/45561; C23C 16/45578; C23C 16/52; C23C 16/4401; C23C 16/45589
See application file for complete search history.

(56) References Cited

U.S. PATENT DOCUMENTS

| | | | | |
|---|---|---|---|---|
| 6,403,968 B1* | 6/2002 | Hazaki | .................... | H01J 37/20 250/442.11 |
| 2007/0243317 A1* | 10/2007 | Du Bois | ............. | C23C 16/4583 118/725 |
| 2015/0330219 A1* | 11/2015 | Chang | .................... | F01C 21/08 418/58 |
| 2018/0087156 A1* | 3/2018 | Fukushima | ......... | C23C 16/4584 |

FOREIGN PATENT DOCUMENTS

JP 2018-056232 A 4/2018

* cited by examiner

*Primary Examiner* — Aiden Lee  
(74) *Attorney, Agent, or Firm* — Nath, Goldberg & Meyer; Jerald L. Meyer; Tanya E. Harkins (57) ABSTRACT

A substrate processing apparatus including: a processing container; an injector provided inside the processing container to have a shape extending in a longitudinal direction and configured to supply a processing gas; a holder fixed to the injector; a windmill fixed to the holder; a first driving-gas supply part configured to supply a driving-gas that rotates the windmill in a first direction; a second driving-gas supply part configured to supply the driving-gas that rotates the windmill in a second direction opposite the first direction; and a driving-gas controller configured to control the supply of the driving-gas from the first driving-gas supply part and the second driving-gas supply part. The injector is rotated about the longitudinal direction corresponding to a rotational axis by rotating the windmill through the supply of the driving-gas from at least one of the first and second driving-gas supply parts under the control of the driving-gas controller.

6 Claims, 9 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2019-132099, filed on Jul. 17, 2019, the entire contents of which are incorporated herein by reference.

TECHNICAL FIELD

The present disclosure relates to a substrate processing apparatus and a substrate processing method.

BACKGROUND

There is known a batch-type substrate processing apparatus, which is capable of performing a film forming process or the like on a plurality of substrates in a state in which the plurality of substrates are held by a substrate holder in multiple stages inside a processing container.

In this batch-type substrate processing apparatus, an injector is provided along an inner wall of the processing container, and a horizontal portion of the injector having an L-shaped shape is inserted into and fixed to a through-hole formed in a lower end flange of the processing container. In addition, a plurality of gas ejection ports are formed in a vertical portion of the injector along a direction (vertical direction) in which the substrates are stacked. Further, a mechanism for rotating the injector is provided.

PRIOR ART DOCUMENT

Patent Document

Patent Document 1: Japanese Laid-Open Patent Publication No. 2018-056232

SUMMARY

According to one embodiment of the present disclosure, there is provided a substrate processing apparatus including: a processing container; an injector provided inside the processing container and having a shape extending in a longitudinal direction, the injector being configured to supply a processing gas; a holder fixed to the injector; a windmill fixed to the holder; a first driving-gas supply part configured to supply a driving-gas that rotates the windmill in a first direction; a second driving-gas supply part configured to supply the driving-gas that rotates the windmill in a second direction opposite the first direction; and a driving-gas controller configured to control the supply of the driving-gas from the first driving-gas supply part and the second driving-gas supply part, wherein the injector is rotated about the longitudinal direction corresponding to a rotational axis by rotating the windmill through the supply of the driving-gas from at least one of the first driving-gas supply part and the second driving-gas supply part under a control of the driving-gas controller.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Embodiments will now be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Further, like reference numerals refer to the same parts and the description thereof will be omitted.

First Embodiment (Substrate Processing Apparatus)

A substrate processing apparatus according to a first embodiment will be described with reference to FIG. 1. However, an object to be processed and a processing content are not particularly limited, and are applicable to various processing apparatuses that perform processing by supplying gas into a processing container.

Figure 1:
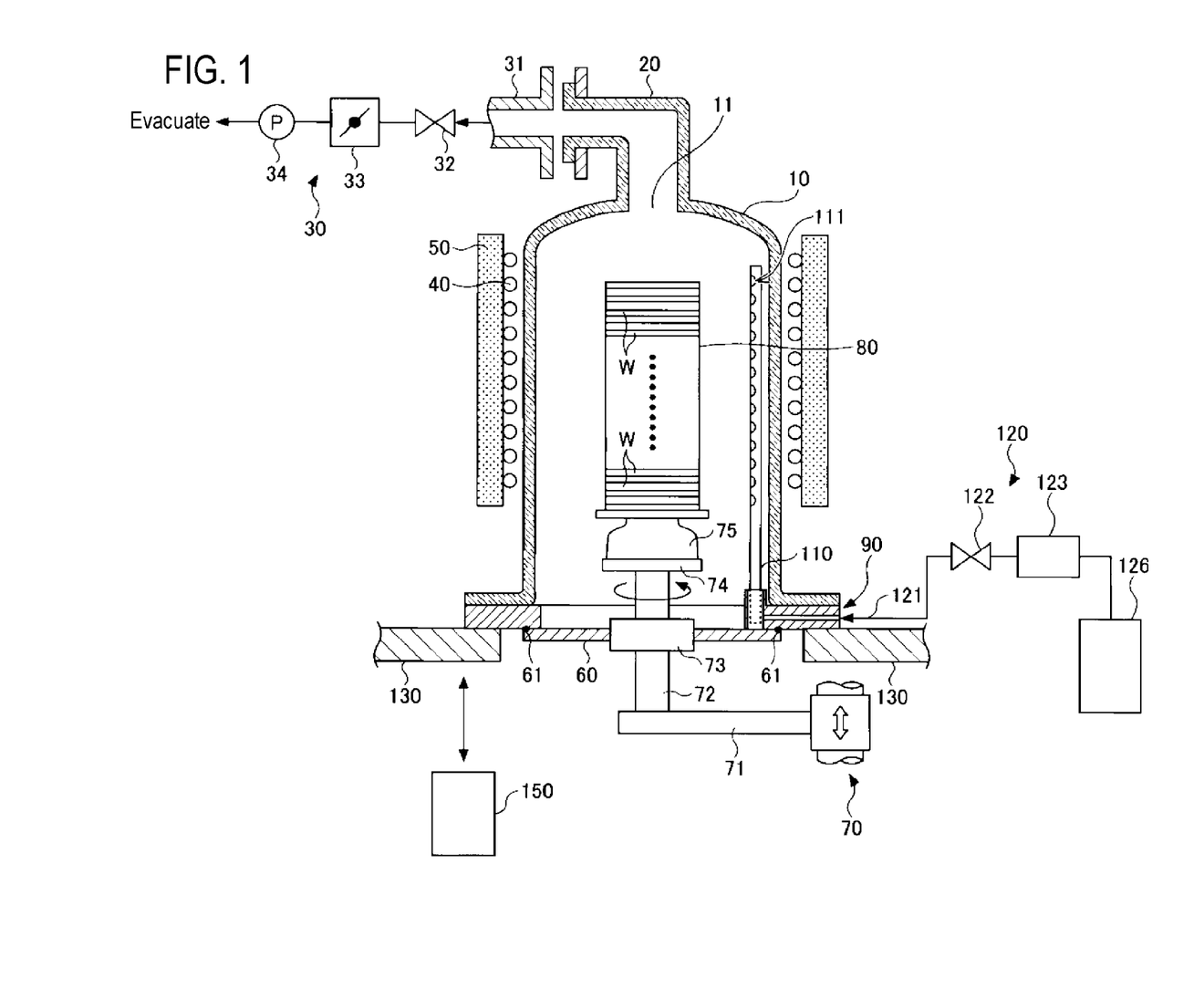
FIG. 1 is a view illustrating a schematic configuration of a substrate processing apparatus according to a first embodiment.

As illustrated in FIG. 1, a substrate processing apparatus according to this embodiment includes a processing container 10 that is capable of accommodating a semiconductor wafer (hereinafter referred to as a "wafer W"). The processing container 10 is formed in a substantially cylindrical shape and is made of quartz having high heat resistance. The processing container 10 has an exhaust port 11 provided in the ceiling portion thereof. The processing container 10 is formed in a vertical shape extending in a vertical (up-down) direction. For example, in a case in which the wafer W to be processed has a diameter of 300 mm, the processing container 10 is formed to have a diameter of about 350 to 450 mm.

A gas exhaust port 20 is connected to the exhaust port 11 formed in the ceiling portion of the processing container 10. The gas exhaust port 20 has, for example, a quartz tube that extends upward from the exhaust port 11 and is bent in an L shape at a right angle with respect to the exhaust port 11.

A vacuum exhaust system 30 for exhausting the interior of the processing container 10 is connected to the gas exhaust port 20. Specifically, the vacuum exhaust system 30 includes a gas exhaust pipe 31 made of a metallic material such as stainless steel and connected to the gas exhaust port 20. In addition, an opening/closing valve 32, a pressure adjustment valve 33 such as a butterfly valve, and a vacuum pump 34 are sequentially provided in the gas exhaust pipe 31. Thus, the interior of the processing container 20 can be exhausted in a state in which an internal pressure of the processing container 10 is adjusted. An inner diameter of the gas exhaust port 20 is set to be equal to that of the gas exhaust pipe 31.

A heating part 40, which is provided on the side portion of the processing container 10 so as to surround the processing container 10, heats the wafer W accommodated in the processing container 10. The heating part 40 is divided, for example, into multiple zones and is formed by a plurality of heaters (not illustrated), heating rates of which can be controlled independently of one another, provided from an upper side toward a lower side in the vertical direction. Further, the heating part 40 may include a single heater without being divided into multiple zones. A heat insulating material 50 is provided on the outer periphery of the heating part 40 to ensure thermal stability.

A lower end portion of the processing container 10 is opened so that the wafer W can be loaded into and unloaded from the processing container 10. The opening of the lower end portion of the processing container 10 is opened and closed by a lid 60.

A wafer boat 80 is provided above the lid 60. The wafer boat 80 is a substrate holder configured to hold the plurality of wafers W, and is formed so as to be capable of holding the plurality of wafers W at intervals in the vertical direction. The number of wafers W held by the wafer boat 80 is not particularly limited and may be, for example, 50 to 150.

The wafer boat 80 is placed on a table 74 via a heat insulating tube 75 formed of quartz. The table 74 is supported on an upper end portion of a rotary shaft 72 that penetrates the lid 60 which opens/closes the lower end opening of the processing container 10. For example, a magnetic fluid seal 73 is provided in the penetrating portion of the rotary shaft 72 so as to rotatably support the rotary shaft 72 while hermetically sealing the rotary shaft 72. In addition, a seal member 61 such as an O-ring is provided on an outer peripheral portion of the upper surface of the lid 60 so that the interior of the processing container 10 can be sealed.

The rotary shaft 72 is attached to a tip end of an arm 71 supported by a lifting mechanism 70 such as a boat elevator or the like, and is formed to be capable of integrally lifting the wafer boat 80, the lid 60, and the like. In some embodiments, the table 74 may be fixed to the lid 60 and the wafers W may be processed without rotating the wafer boat 80.

An annular manifold 90 is disposed at the lower end portion of the processing container 10. Then, a required gas is introduced into the processing container 10 from the lower end portion of the processing container 10 via the manifold 90. Although the manifold 90 is configured as a component separated from the processing container 10, the manifold 90 may be provided integrally with the side wall of the processing container 10, or may be provided so as to form a portion of the side wall of the processing container 10.

Accordingly, in the substrate processing apparatus according to the present embodiment, a space sealed by the processing container 10, the manifold 90, and the lid 60 is formed.

The manifold 90 supports an injector 110. The injector 110 is a tubular member for supplying a gas into the processing container 10, and is made of, for example, quartz. The injector 110 is formed in a longitudinally-extending shape, and is installed inside the processing container 10 such that the longitudinal direction is the vertical direction. A plurality of gas holes 111 are formed in the injector 110 at predetermined intervals in the longitudinal direction so as to eject the gas in the horizontal direction therefrom. A single injector 110 may be provided, or a plurality of injectors 110 may be provided.

Figure 2A:
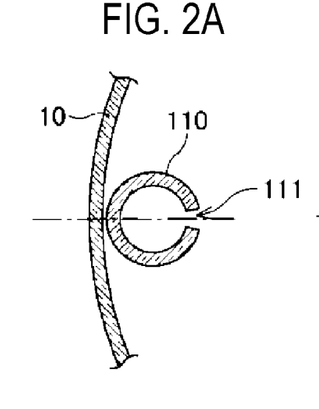
FIGS. 2A to 2C are explanatory views for explaining an injector of the substrate processing apparatus according to the first embodiment.
Figure 2B:
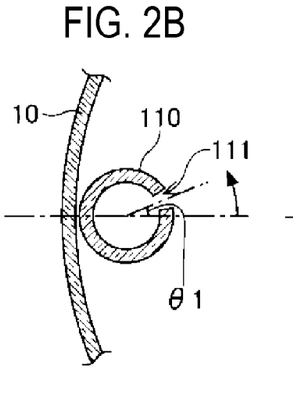
Figure 2C:
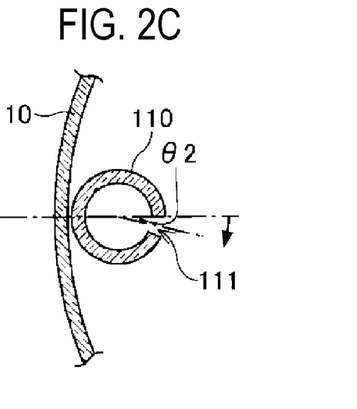

FIGS. 2A to 2C are cross-sectional views taken along a direction perpendicular to the longitudinal direction of the injector for illustrating the injector of the substrate processing apparatus in FIG. 1. In FIGS. 2A to 2C, one injector 110 is illustrated as an example. FIG. 2A illustrates a state of the injector 110 at the origin position thereof. In addition, FIG. 2B illustrates a state of the injector 110 at a position rotated counterclockwise from the origin position by a predetermined angle θ1, and FIG. 2C illustrates a state of the injector 110 at a position rotated clockwise from the origin position by a predetermined angle θ2.

The injector 110 is configured to be rotatable counterclockwise and clockwise by a rotation mechanism to be described later. Specifically, the injector 110 may be rotatable counterclockwise from the position where the gas holes 111 face the center of the processing container 10 as illustrated in FIG. 2A, to the position at the angle θ1 as illustrated in FIG. 2B. Further, the injector 110 may be rotatable clockwise to the position at the angle θ2 as illustrated in FIG. 2C. Then, by rotating the injector 110 in a state in which the gas is ejected from the gas holes 111 of the injector 110 in the horizontal direction, it is possible to control the in-plane distribution of processing performed on the wafers W. The sum of the angle θ1 and the angle θ2 is, for example, 90 degrees.

As illustrated in FIG. 1, a gas supply system 120 for supplying a gas to the injector 110 is connected to the injector 110. The gas supply system 120 includes a gas pipe 121 made of a metal, for example, stainless steel, and communicating with the injector 110, and a gas cylinder 126 connected to the gas pipe 121. In addition, a flow rate controller 123 such as a mass flow controller or the like, and an opening/closing valve 122 are sequentially provided in the gas pipe 121. Thus, it is possible to supply the processing gas supplied from the gas cylinder 126 while controlling a flow rate thereof. Other processing gases necessary for processing the wafers W are also supplied via gas supply systems configured similarly to the gas supply system 120 and the manifold 90.

A peripheral portion of the manifold 90 at the lower end portion of the processing container 10 is supported by a base plate 130 made of, for example, stainless steel. The base plate 130 supports the load of the processing container 10. Below the base plate 130, a wafer transfer chamber including a wafer transfer mechanism (not illustrated) and having a nitrogen gas atmosphere of a substantially atmospheric pressure level is provided. Above the base plate 130, a clean room having a clean air atmosphere is provided.

In addition, as illustrated in FIG. 1, a controller 150 that controls the entire substrate processing apparatus is provided. The controller 150 controls operations of various devices in the substrate processing apparatus according to a recipe such that processing is performed under various processing conditions indicated in the recipe. In addition, the controller 150 receives signals from various sensors provided in the substrate processing apparatus so as to grasp positions of the wafers W and the like, and performs a sequence control for proceeding with the processing. In addition, the controller 150 may receive physical measurement values and the like detected by various detectors provided in the substrate processing apparatus so as to detect the state of substrate processing and perform a feedback control and the like necessary for appropriately performing the substrate processing.

The controller includes a calculation part, such as a central processing unit (CPU), a read only memory (ROM), a random access memory (RAM), and a storage part. The controller 150 may be configured as a microcomputer in which a program for processing a recipe is installed from a storage medium where the program is stored, and which executes processing for the recipe. The controller 150 may also be configured as an electronic circuit such as an application specific integrated circuit (ASIC).

(Gas Introduction Mechanism)

Figure 3:
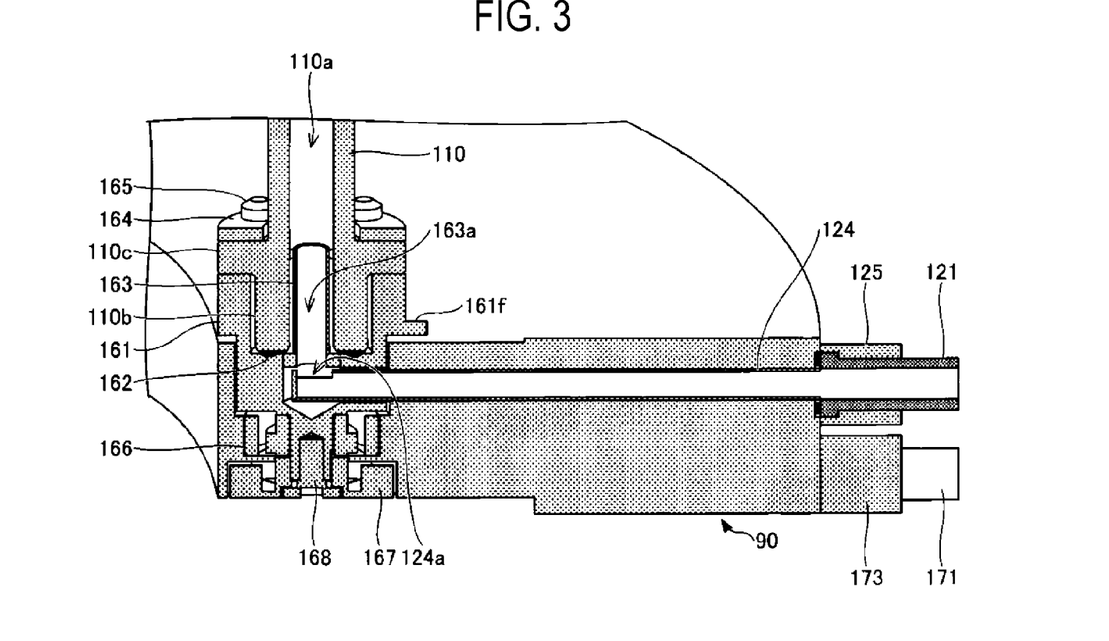
FIG. 3 is a cross-sectional perspective view of a main part of the substrate processing apparatus according to the first embodiment.
Figure 4:
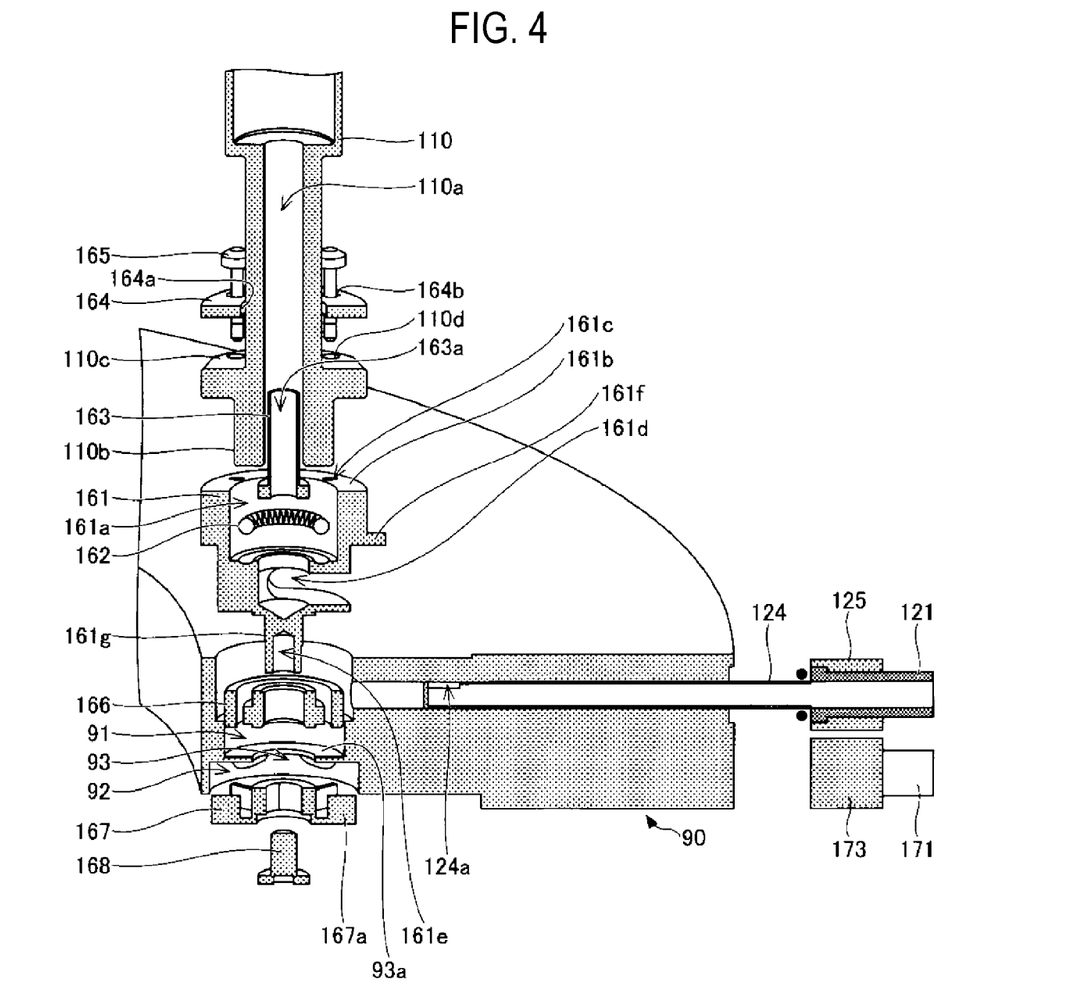
FIG. 4 is a cross-sectional exploded perspective view of the main part of the substrate processing apparatus according to the first embodiment.

Next, a gas introduction mechanism of the substrate processing apparatus according to the present embodiment will be described in more detail with reference to FIGS. 3 and 4. FIG. 3 is a cross-sectional perspective view of the gas introduction mechanism of the substrate processing apparatus according to the present embodiment, and FIG. 4 is an exploded perspective view thereof.

In the substrate processing apparatus according to the present embodiment, an upper surface of the manifold 90 has a circular upper opening 91, and the lower surface of the manifold 90 corresponding to the upper opening 91 has a circular lower opening 92. In addition, the manifold 90 has a bearing support portion 93a having a through-hole 93 formed therein that communicates with the upper opening 91 and the lower opening 92.

The manifold 90 is made of a metal, for example, a corrosion-resistant metallic material such as stainless steel, aluminum, Hastelloy, or the like. The processing container 10 and components constituting the processing container 10 are formed of, for example, quartz from the viewpoint of preventing metal contamination.

The injector 110 is made of quartz. A holder 161 made of a metal such as Hastelloy is attached to the lower side of the injector 110. Specifically, a gas flow path 110a is formed inside the injector 110. A lower insertion portion 110b is provided at the lower side of the injector 110. A fixing portion 110c that extends outward in the circumferential direction is provided above the lower insertion portion 110b. In addition, screw holes 110d are formed in the fixing portion 110c.

A circular recess 161a into which the lower insertion portion 110b of the injector 110 is inserted is provided in the upper side of the holder 161. A ring-shaped spring 162 formed of a coil spring is inserted into the recess 161a of the holder 161. Further, the lower insertion portion 110b of the injector 110 is inserted in the state in which a gas pipe 163 is inserted into the lower insertion portion 110b. The gas pipe 163 is formed with a through-hole 163a serving as a gas flow path. A portion of the gas pipe 163 is inserted into the gas flow path 110a at the lower side of the injector 110.

A disc-shaped pressing plate 164 is provided above the fixed portion 110c of the injector 110. The pressing plate 164 has a through-hole 164a, into which the injector 110 is inserted, at the center thereof, and screw holes 164b provided around the through-hole 164a. An upper surface 161b of the holder 161 is provided with a plurality of screw holes 161c. The fixing portion 110c of the injector 110 is fixed by screws 165 in the state of being sandwiched between the holder 161 at the lower side and the holding plate 164 at the upper side.

In this manner, the spring 162, the gas pipe 163, and the lower insertion portion 110b of the injector 110 are inserted into the recess 161a of the holder 161, and are fixed by the screws 165 via the pressing plate 164. The holder 161 is inserted into the upper opening portion 91 of the manifold 90 via a bearing 166. A lower fixing portion 161g of the holder 161 passes through an opening portion of the bearing 166 and the through-hole 93, and is exposed to the side of the lower opening portion 92.

The lower fixing portion 161g of the holder 161 is a portion that is fixed to a windmill 167. A stepped shape is provided at the center of the bottom surface of the holder 161 so as to protrude downward. When the stepped shape and a rotary portion of the bearing 166 are fixed in contact with each other, a gap is formed between an outer a top surface of the outside (stationary portion) of the bearing 166 and the bottom surface of the holder 161.

In the present embodiment, the spring 162 is deformed by the fastening of the screws 165, and thus the elastic force generates a force to push the injector 110 upward. A gap is formed between the bottom surface of the fixing portion 110c and the top surface 161b of the holder 161, and the inclination of the injector 110 can be adjusted by the degree of fastening the plurality of screws 165. For example, when the injector 110 is installed so as to abut against the inner wall of the processing container 10, the screws on the inner wall side of the processing container 10 may be further tightened and the screws on the side of the boat may be loosely tightened. The pressing plate 164 may be a single plate or may be divided into a plurality of plates.

An opening portion 161d into which a sleeve 124 for supplying a gas is inserted is provided below the recess 161a of the holder 161. The gas pipe 121 attached to the fixing block 125 is connected to one end of the sleeve 124 via a gasket, and a hole 124a opened upward is formed near the other end of the sleeve 124.

The sleeve 124 is formed to penetrate from one end to the other end thereof. Thus, a processing gas such as a film-forming gas, supplied from the gas pipe 121, flows through the interior of the sleeve 124 from the one end to the other end, and exits upward from the hole 124a near the other end of the sleeve 124. The processing gas discharged from the hole 124a near the other end of the sleeve 124 passes through the through-hole 163a inside the gas pipe 163 and flows upward through the gas flow path 110a inside the injector 110.

In the present embodiment, the windmill 167 is inserted into the lower opening portion 92 of the manifold 90, and is fixed by a screw 168 that is inserted into a screw hole 161e in the lower fixing portion 161g of the holder 161. The bearing 166 is formed of silicon nitride (SiN) from the viewpoint of heat resistance and corrosion resistance. The holder 161, the spring 162, the gas pipe 163, the pressing plate 164, the screws 165, the windmill 167, and the screw 168 are formed of Hastelloy.

In the present embodiment, in a method of assembling the parts formed by the above members, first, the bearing 166 is installed in the upper opening portion 91 of the manifold 90. Subsequently, from the upper side of the bearing 166, the lower fixing portion 161g of the holder 161 is inserted into the opening portion of the bearing 166 and the through-hole 93, the windmill 167 is inserted into the lower opening portion 92 of the manifold 90, and the windmill 167 is fixed to the lower fixing portion 161g of the holder 161 by the screw 168. Subsequently, the spring 162, the gas pipe 163, and the lower insertion portion 110b of the injector 110 are sequentially inserted into the recess 161a of the holder 161, and the pressing plate 164 is placed on the fixing portion 110c and fixed by the screws 165. As a result, the holder 161 and the injector 110 are fixed. Subsequently, the sleeve 124 for supplying the processing gas is inserted into the manifold 90, the gas pipe 121 is connected to the manifold 90 via a gasket, and the fixing block 125 is fixed to the manifold 90 with a screw. Thereafter, a first driving-gas pipe 171 and a second driving-gas pipe 172 are connected to the manifold 90 via a gasket, and a fixing block 173 is fixed to the manifold 90 with a screw. The assembling process can be implemented through the above steps.

Figure 5:
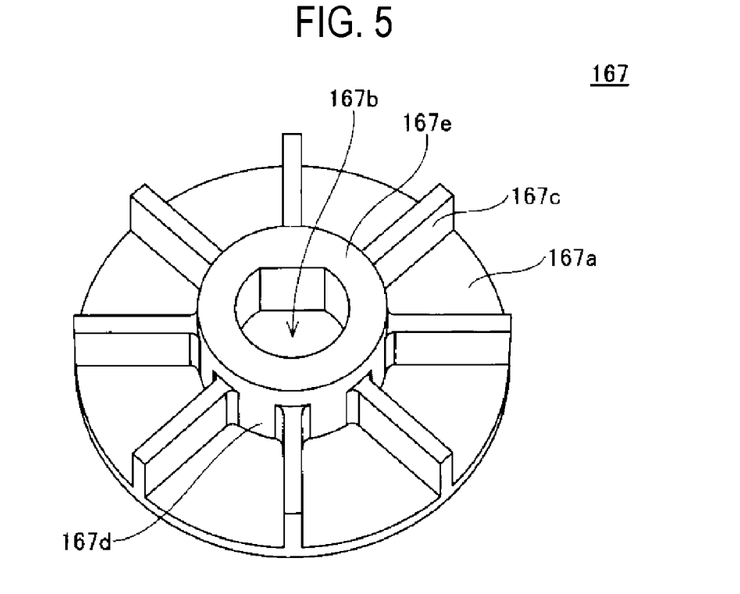
FIG. 5 is a perspective view of a windmill of the substrate processing apparatus according to the first embodiment.
Figure 6:
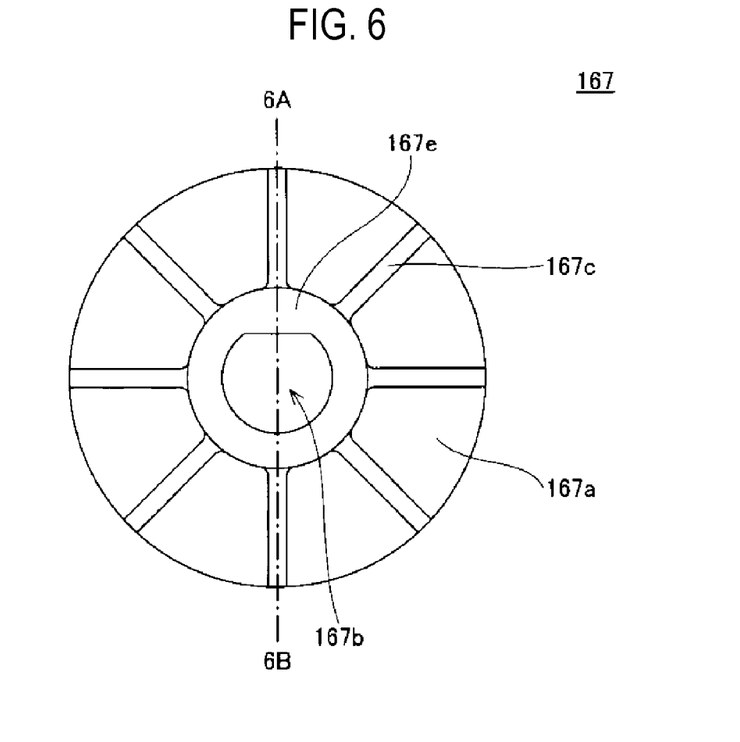
FIG. 6 is a top view of the windmill of the substrate processing apparatus according to the first embodiment.
Figure 7:
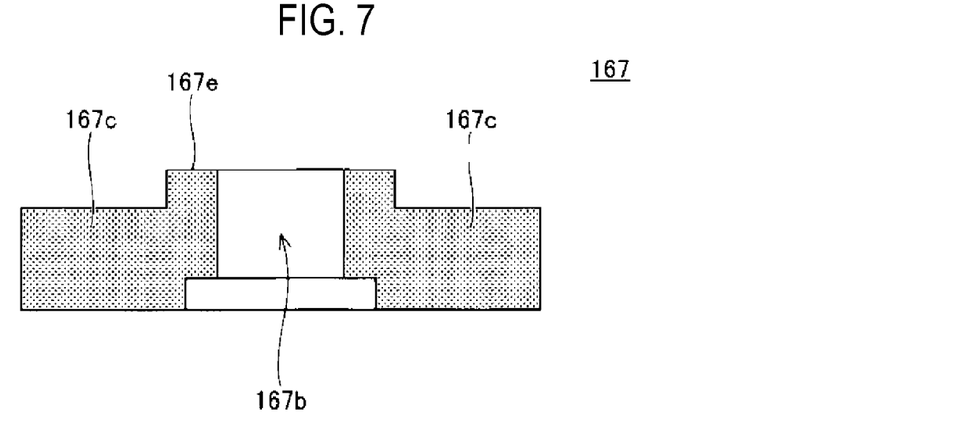
FIG. 7 is a cross-sectional view of the windmill of the substrate processing apparatus according to the first embodiment.

Next, the windmill 167 will be described with reference to FIGS. 5 to 7. FIG. 5 is a perspective view of the windmill 167, FIG. 6 is a top view of the windmill 167, and FIG. 7 is a cross-sectional view taken along one-dot chain line 6A-6B in FIG. 6. The windmill 167 has a through-hole 167b formed in the central portion of a disc-shaped portion 167a. A plurality of fins 167c are provided to extend in a circumferential direction from the portion where the through-hole 167b is provided. As described above, the windmill 167 is fixed to the holder 161 by inserting and fixing the screw 168, which has been inserted into the through-hole 167b of the windmill 167, into the screw hole 161e.

The windmill 167 includes the disc-shaped portion 167a, a windmill-fixing portion 167d provided in the central portion of the disc-shaped portion 167a to protrude upward and having the through-hole 167b formed in the central portion thereof, and the plurality of fins 167c extending in a circumferential direction from the windmill-fixing portion 167d. The height of each fin 167c is formed to be lower than that of the windmill-fixing portion 167d. The outer diameter of the windmill-fixing portion 167d is set to be smaller than the inner diameter of the through-hole 93 and to be substantially equal to the outer diameter of the rotary portion of the bearing 166. Thus, when the windmill 167 and the holder 161 are fixed by the screw 168, a top surface 167e of the windmill-fixing portion 167d and the bottom surface of the rotary portion of the bearing 166 are in contact with each other. With such a structure, the fins 167c are rotatable without coming into contact with other members.

Figure 8:
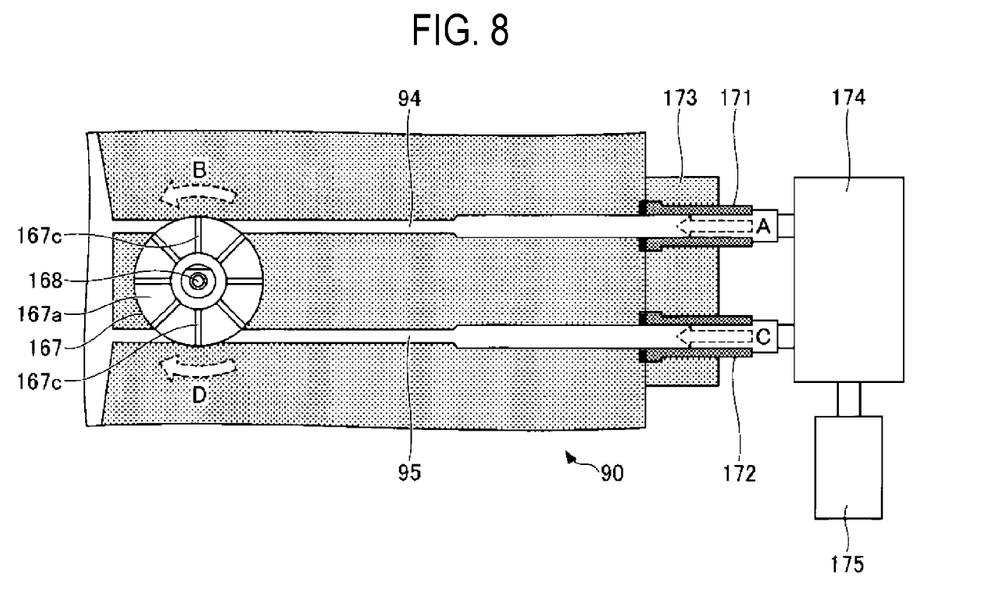
FIG. 8 is an explanatory view for explaining the rotation of the injector of the substrate processing apparatus according to the first embodiment.
Figure 9:
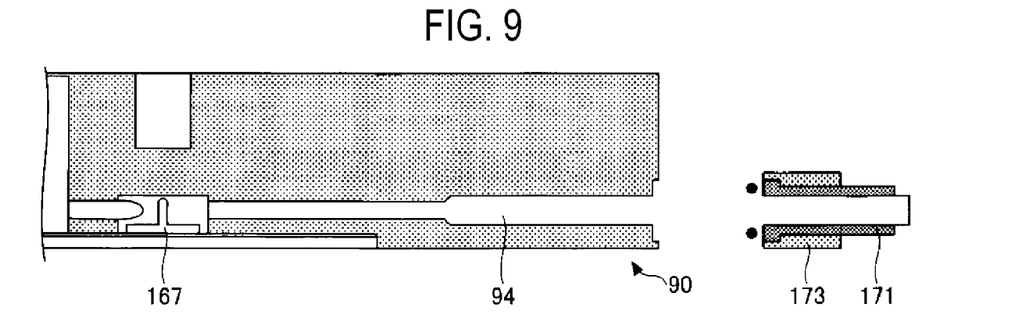
FIG. 9 is an explanatory view for explaining the rotation of the injector of the substrate processing apparatus according to the first embodiment.
Figure 10:
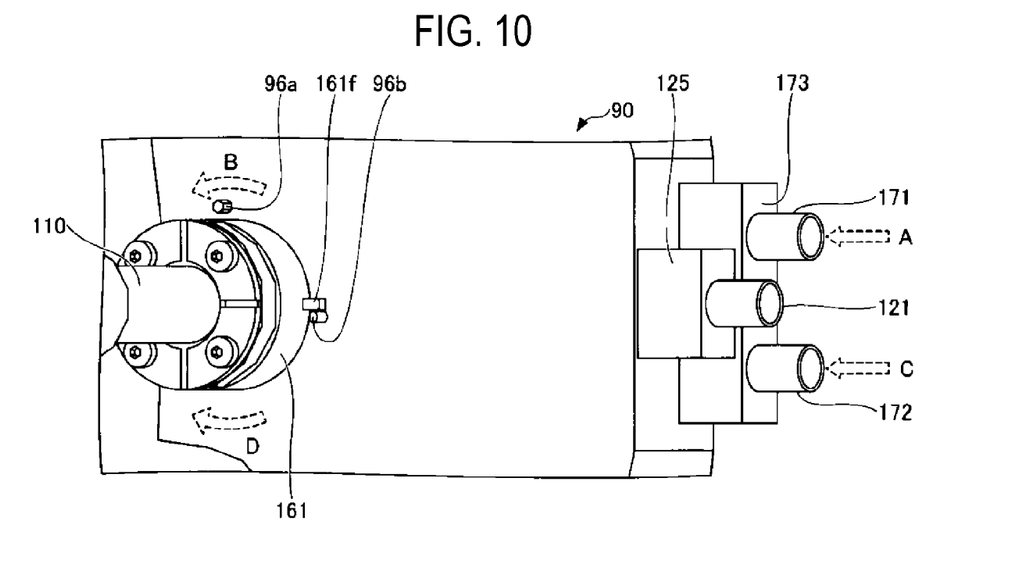
FIG. 10 is an explanatory view for explaining the rotation of the injector of the substrate processing apparatus according to the first embodiment.

Next, the rotation of the windmill 167 will be described with reference to FIGS. 8 to 10. FIG. 8 is a cross-sectional view of a portion in which the windmill 167 is provided, taken along a plane parallel to the disc-shaped portion 167a, and FIG. 9 is a cross-sectional view of a portion in which the first driving-gas pipe 171 and a first driving-gas flow path 94 are provided, taken along a plane perpendicular to the disc-shaped portion 167a of the windmill 167. FIG. 10 is a perspective view of a main part of the top surface side of the manifold 90.

In the present embodiment, the windmill 167 is rotated by virtue of wind power of the supplied gas. Specifically, two driving-gas pipes for rotating the windmill 167, that is, the first driving-gas pipe 171 and the second driving-gas pipe 172, are attached to the manifold 90 by the fixing block 173 via respective gaskets. The manifold 90 is provided with the first driving-gas flow path 94 through which the gas supplied from the first driving-gas pipe 171 flows, and a second driving-gas pipe 95 through which the gas supplied from the second driving-gas pipe 172 flows. Herein, the first driving-gas flow path 94 may be referred to as a first driving-gas supply part, and the second driving-gas flow path 95 may be referred to as a second driving-gas supply part.

The first driving-gas pipe 171 and the second driving-gas pipe 172 are connected to a driving-gas controller 174. A driving-gas cylinder 175 serving as a driving-gas source is connected to the driving-gas controller 174. Inside the drive gas controller 174 at the downstream side of the driving-gas cylinder 175, a mass flow controller (not illustrated) that adjusts a flow rate of a driving-gas and an opening/closing valve (not illustrated) that perform the supply and cutoff of the driving-gas are sequentially provided. The mass flow controller and the opening/closing valve are provided in a correspondence relationship with each of the first driving-gas pipe 171 and the second driving-gas pipe 172. Two driving-gas cylinders 175 may be provided so as to be connected to the first driving-gas pipe 171 and the second driving-gas pipe 172, respectively, or the driving-gas cylinder 175 may be shared by the pipes. The driving-gas is an inert gas, for example, a nitrogen gas.

The nitrogen gas serving as the driving-gas is stored in the driving-gas cylinder 175, and is supplied from the driving-gas cylinder 175 to the driving-gas controller 174. The driving-gas controller 174 controls the supply of the driving-gas to the first driving-gas pipe 171 and the second driving-gas pipe 172. The driving-gas controller 174 may be connected to the controller 150 so as to control the supply of the driving-gas under the control of the controller 150.

In the present embodiment, the driving-gas is supplied to the first driving-gas pipe 171 as illustrated by the broken line arrow A in FIGS. 8 and 10. The driving-gas thus supplied flows through the first driving-gas flow path 94 toward the portion in which the windmill 167 is provided, and hits the fins 167c of the windmill 167, so that the windmill 167 is rotated counterclockwise as indicated by the broken line arrow B. Along with this, the holder 161 to which the windmill 167 is fixed also rotates, and thus, the injector 110 fixed to the holder 161 also rotates.

Subsequently, the supply of the driving-gas to the first driving-gas pipe 171 is stopped, and the driving-gas is supplied to the second driving-gas pipe 172, as indicated by the broken line arrow C in FIGS. 8 and 10. The driving-gas thus supplied flows through the second driving-gas flow path 95 toward the portion in which the windmill 167 is provided, and hits the fins 167c of the windmill 167, so that the windmill 167 is rotated clockwise as indicated by the broken line arrow D. Along with this, the holder 161 to which the windmill 167 is fixed also rotates, and thus, the injector 110 fixed to the holder 161 also rotates.

As described above, based on the control by the driving-gas controller 174, by alternately repeating the supply of the driving-gas to the first driving-gas pipe 171 and the second driving-gas pipe 172, it is possible to rotate the injector 110 while alternately changing the rotational directions thereof.

In the present embodiment, in order to limit the rotation angle of the holder 161, as illustrated in FIG. 10, the outer periphery of the holder 161 is provided with a protrusion 161f protruding outward in the circumferential direction. Two pins 96a and 96b are formed on the top surface of the manifold 90.

When the driving-gas is supplied to the first driving-gas pipe 171, the holder 161 is rotated as indicated by the broken arrow B, the protrusion 161f of the holder 161 comes into contact with the pin 96a provided on the manifold 90, so that the rotation of the holder 161 is stopped. In addition, when the driving-gas is supplied to the second driving-gas pipe 172, the holder 161 is rotated as indicated by the broken arrow D, the protrusion 161f of the holder 161 comes into contact with the pin 96b provided on the manifold 90, so that the rotation of the holder 161 is stopped. In this embodiment, the rotation angle of the holder 161 may be freely set by changing the positions of the pins 96a and 96b.

Figure 11:
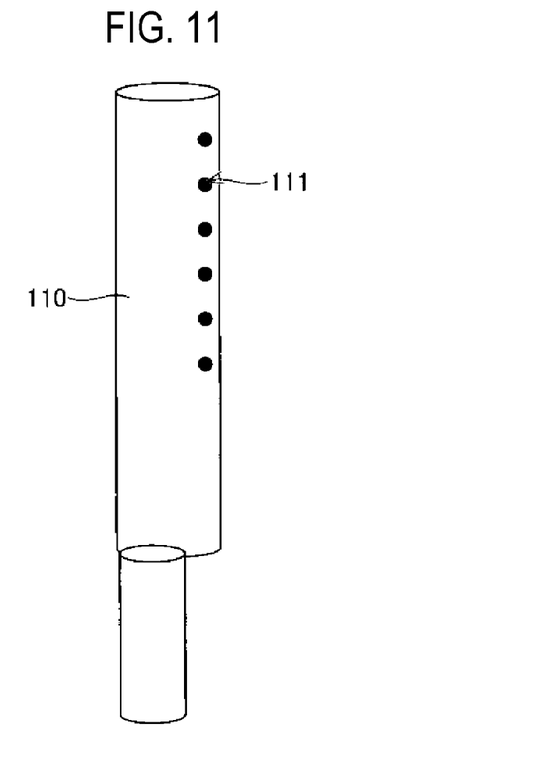
FIG. 11 is a perspective view of another injector of the substrate processing apparatus according to the first embodiment.
Figure 12:
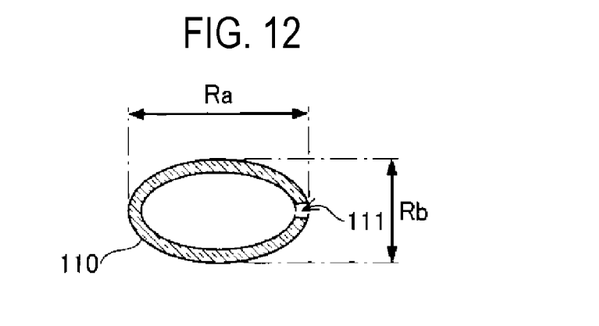
FIG. 12 is a top view of another injector of the substrate processing apparatus according to the first embodiment.

In the foregoing, as illustrated in FIGS. 2A to 2C and the like, the case where the structure of the injector 110 has a circular tubular shape has been described, but the injector 110 may have an elliptically cylindrical shape as illustrated in FIGS. 11 and 12. In this case, for example, a long diameter Ra of the ellipse of the injector 110 is 30 mm, and a short diameter Rb is 20 mm. When the wafer boat 80 and the injector 110 are brought close to each other, the column of the wafer boat 80 and the injector 110 may collide with each other when the wafer boat 80 is rotated. Therefore, by using the elliptic injector 110 illustrated in FIGS. 11 and 12, it is possible to prevent the column of the wafer boat 80 and the injector 110 from colliding with each other by rotating the injector 110.

(Substrate Processing Method)

Next, a substrate processing method using the substrate processing apparatus according to the present embodiment will be described. When substrate processing is performed, in the state in which the plurality of wafers W, (e.g., about 50 to 150 wafers W) are placed on the wafer boat 80, the wafer boat 80 is placed on the table 74 above the lid 60, and the lid 60 is raised to hermetically seal the processing container 10. In this manner, the wafers W are placed inside the processing container 10. Although only one injector 110 is illustrated in FIG. 1, a plurality of injectors (not illustrated) may be provided.

Subsequently, the interior of the processing container 10 is exhausted using the vacuum pump 34 illustrated in FIG. 1 until an internal pressure of the processing container 10 reaches a predetermined pressure.

Subsequently, the wafer boat 80 is rotated and the processing gas is supplied from the injector 110. Various processing gases may be selected depending on the intended use. For example, in a case of forming a silicon oxide film, a silicon-containing gas and an oxidizing gas are supplied. The silicon-containing gas may be, for example, an aminosilane gas, and the oxidizing gas may be, for example, an ozone gas. By reacting the aminosilane gas and the ozone gas with each other, silicon oxide is deposited on the wafer W as a reaction product, whereby a silicon oxide film is formed on the wafer W.

Figure 13:
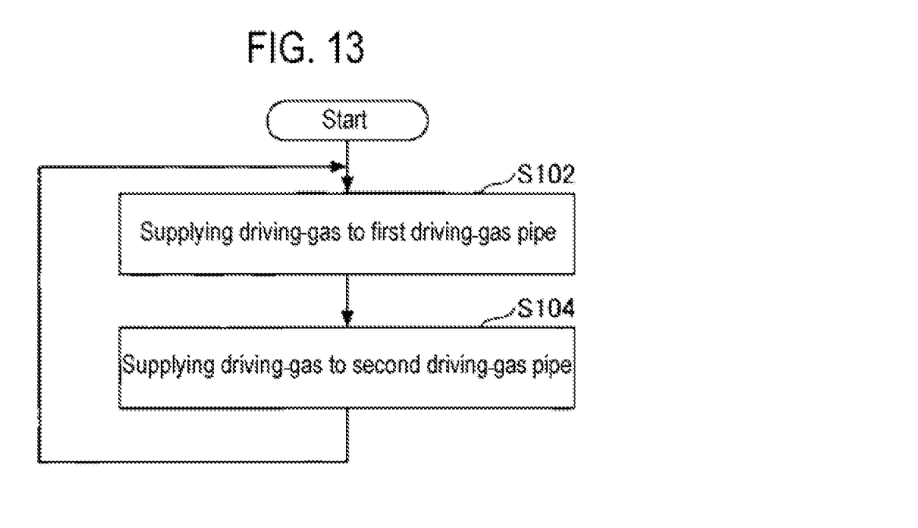
FIG. 13 is a flowchart illustrating a substrate processing method according to the first embodiment.

In the present embodiment, as illustrated in FIG. 13, when the silicon oxide film is formed, the injector 110 is rotated while the rotational directions thereof are alternately changed under the control of the driving-gas controller 174.

First, as illustrated in step S102, in the state in which the supply of the driving-gas to the second driving-gas pipe 172 is stopped, the driving-gas is supplied to the first driving-gas pipe 171 so as to rotate the windmill 167, and thereby rotating the holder 161 and the injector 110. The holder 161 rotates until the protrusion 161f provided on the holder 161 comes into contact with the pin 96a. Once the protrusion 161f comes into contact with the pin 96a, the rotation of the holder 161 is stopped. In a case in which the processing gas is a highly reactive gas, by supplying the driving-gas even after the rotation of the holder is stopped, it is possible to prevent the processing gas from entering a region where the windmill 167, the bearing 166, and the like are provided. This makes it possible to prevent the windmill 167, the bearing 166, and the like from corroding due to the processing gas.

Subsequently, as illustrated in step S104, the supply of the driving-gas to the first driving-gas pipe 171 is stopped, and the driving-gas is supplied to the second driving-gas pipe 172 so as to rotate the injector 110 in a direction opposite the direction in step S102. The holder 161 rotates until the protrusion 161f provided on the holder 161 comes into contact with the pin 96b. After the protrusion 161f comes into contact with the pin 96b, the rotation of the holder 161 is stopped. In the case in which the processing gas is a highly reactive gas, by supplying the driving-gas even after the rotation of the holder is stopped, it is possible to prevent the processing gas from entering the region where the windmill 167, the bearing 166, and the like are provided. This makes it possible to prevent the windmill 167, the bearing 166, and the like from corroding due to the processing gas.

In the present embodiment, step S102 and step S104 are alternately repeated until the formation of the silicon oxide film is completed, whereby the injector 110 is rotated while the rotational directions thereof are alternately changed.

In the present embodiment, in the case of chemical vapor deposition (CVD)-based film formation, the aminosilane gas and the ozone gas are simultaneously supplied into the processing container 10. On the other hand, in the case of atomic layer deposition (ALD)-based film formation, only the aminosilane gas is initially supplied into the processing container 10 to be adsorbed onto the surface of each wafer W. Then, after purging the interior of the processing container 10 with a purge gas, only the ozone gas is supplied into the processing container 10 to react with the aminosilane gas adsorbed onto the surface of each wafer W, so that a silicon oxide film is formed on the surface of each wafer W by the reaction. Then, after supplying the purge gas into the processing container 10, a cycle including the supply of the aminosilane gas, the supply of the purge gas, the supply of the ozone gas, and the supply of the purge gas supply is further repeated so as to gradually deposit additional silicon oxide films on the surface of each wafer W.

In the present embodiment, the number of members required to rotate the injector 110 inside the processing container 10 is smaller than that required when using an air cylinder, a motor, and the like. Further, when the air cylinder, the motor, and the like are used, members such as a link part and a gear are required to rotate the injector 110. In the present embodiment, the driving-gas is supplied to rotate the windmill. Therefore, it is possible to greatly reduce the number of contact points between members. This makes it possible to suppress the generation of particles, to reduce costs, and to achieve savings in space.

In addition, when the air cylinder, the motor, and the like are used, it is necessary to install the air cylinder, the motor, and the like in the immediate vicinity of the manifold. However, when these members are heated by heat generated when heating the wafers, the members may be thermally expanded and damaged. In contrast, in the present embodiment, a configuration in which the windmill 167 is rotated by the driving-gas without using the air cylinder, the link part, and the like is applied. Thus, members other than the windmill 167 and the like are not heated by the heat generated when the wafers are heated, and can be prevented from being thermally expanded and damaged.

Second Embodiment

Next, a substrate processing method according to a second embodiment will be described with reference to FIG. 14. The present embodiment relates to a substrate processing method in which the injector 110 is rotated while the rotational directions of the injector 110 are alternately changed by a method different from that of the first embodiment.

Figure 14:
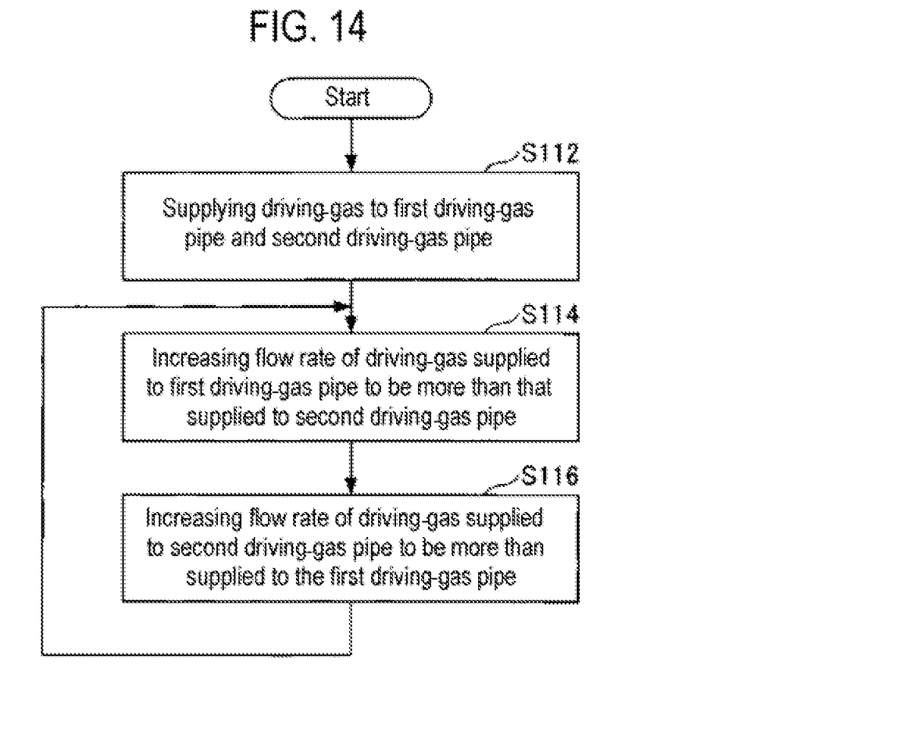
FIG. 14 is a flowchart illustrating a substrate processing method according to a second embodiment.

In the present embodiment, as illustrated in FIG. 14, when a silicon oxide film is formed, the injector 110 is rotated while the rotational directions thereof are alternately changed under the control of the driving-gas controller 174.

Specifically, first, as illustrated in step S112, the driving-gas is simultaneously supplied to the first driving-gas pipe 171 and the second driving-gas pipe 172. In this case, when a flow rate of the drive gas supplied to the first driving-gas pipe 171 and a flow rate of the drive gas supplied to the second driving-gas pipe 172 are equal to each other, the windmill 167 does not rotate. Thus, the injector 110 is also stopped without rotating.

Subsequently, as illustrated in step S114, the flow rate of the driving-gas supplied to the first driving-gas pipe 171 is increased to be more than that of the driving-gas supplied to the second driving-gas pipe 172 for a predetermined period of time. As a result, the driving-gas supplied to the first driving-gas pipe 171 has a stronger force for rotating the windmill 167 than that of the driving-gas supplied to the second driving-gas pipe 172. Accordingly, only for the time period, the windmill 167 is rotated by the driving-gas supplied to the first driving-gas pipe 171, and thus, the injector 110 is also rotated in the same direction.

Subsequently, as illustrated in step S116, the flow rate of the driving-gas supplied to the second driving-gas pipe 172 is increased to be more than that of the driving-gas supplied to the first driving-gas pipe 171 for a predetermined period of time. As a result, the driving-gas supplied to the second driving-gas pipe 172 has a stronger force for rotating the windmill 167 than that of the driving-gas supplied to the first driving-gas pipe 171. Therefore, only for the time period, the windmill 167 is rotated in a direction opposite to that in step S116, and thus, the injector 110 is also rotated in the same direction.

Thereafter, the process proceeds to step S114 again, and steps S114 and S116 are alternately repeated until the formation of the silicon oxide film is completed, and the injector 110 is rotated while the rotational directions thereof are alternately changed.

In the present embodiment, the rotation angle of the injector 110 may be set to a predetermined angle by adjusting the flow rate of the driving-gas and the time period for which a large amount of the driving-gas is supplied. Therefore, the protrusion 161*f*, the pins 96*a* and 96*b*, and the like provided on the holder 161 in the first embodiment may be omitted.

The contents other than the above are similar to those in the first embodiment.

Third Embodiment

Figure 15:
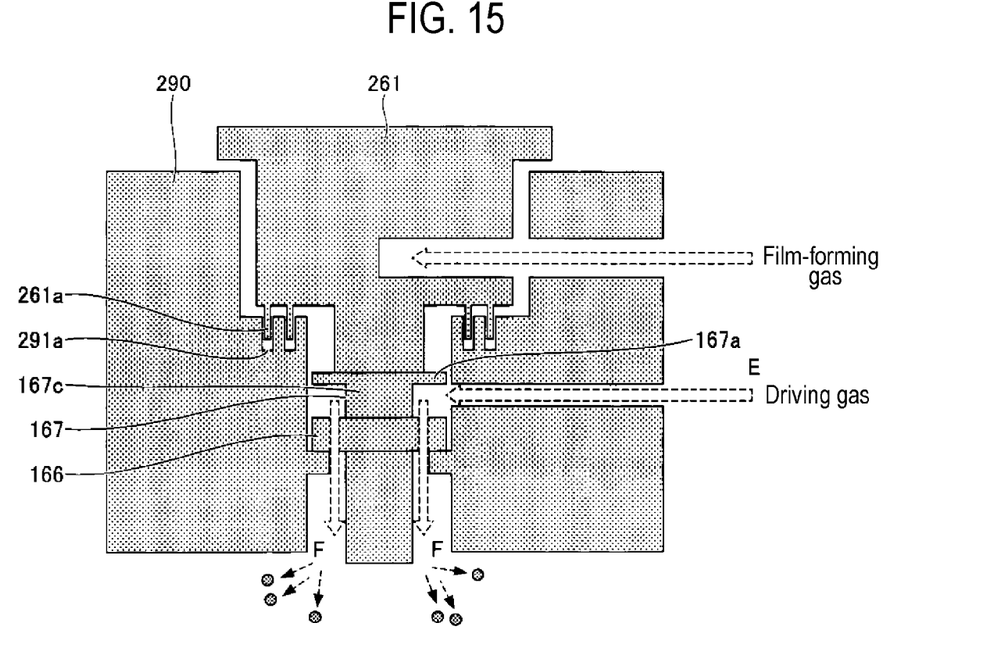
FIG. 15 is an explanatory view for explaining a substrate processing apparatus according to a third embodiment.

Next, a substrate processing apparatus according to a third embodiment will be described with reference to FIG. 15. The substrate processing apparatus according to the present embodiment has a configuration in which fins 167*c* provided on the windmill 167 are installed so as to orient downward. A bearing 166 is installed below the windmill 167. As described above, by attaching the windmill 167 in the opposite direction to that of the first embodiment, the driving-gas supplied in a direction indicated by the broken line arrow E hits the fins 167*c* of the windmill 167 and flows downward, as indicated by the broken line arrows F. In the substrate processing apparatus, since the wafers to be subjected to the film formation exist at the upper side, even if particles are generated in the windmill 167, the bearing 166, and the like, the particles hardly flow to the upper side where the wafers are arranged, and flow to the lower side at which no wafers exist. This makes it possible to prevent particles from adhering to the surface of each wafer even if the particles are generated in the windmill 167, the bearing 166, and the like.

Further, in the present embodiment, irregularities, namely irregularities 261*a* in a holder 261 and irregularities 291*a* in a manifold 290 are formed on respective surfaces of the holder 261 and the manifold 290, which face each other. The irregularities 261*a* and 291*a* have shapes corresponding to each other such that a labyrinth structure is formed. As described above, with the labyrinth structure, even if particles are generated in the windmill 167, the bearing 166, and the like, it is possible to prevent the particles from flowing to the side of the wafers.

The contents other than the above are similar to those in the first embodiment.

In the above embodiments, the case where a predetermined film is formed on each wafer W has been described as an example, but the present disclosure is not limited thereto. The present disclosure is also applicable to, for example, a process in which a film-forming step of supplying a film-forming gas to each wafer W to form a predetermined film on each wafer W, and an etching step of supplying an etching gas to etch the predetermined film are repeated.

According to the substrate processing apparatus disclosed herein, it is possible to suppress the generation of particles when an injector is rotated.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A substrate processing apparatus comprising:
a processing container;

an injector provided inside the processing container and having a shape extending in a longitudinal direction, the injector configured to supply a processing gas;

a holder fixed to the injector;

a windmill fixed to the holder;

a first driving-gas supplier configured to supply a driving-gas that rotates the windmill in a first direction;

a second driving-gas supplier configured to supply the driving-gas that rotates the windmill in a second direction opposite the first direction; and a driving-gas controller configured to control the supply of the driving-gas from the first driving-gas supplier and the second driving-gas supplier, wherein the injector is rotated about the longitudinal direction corresponding to a rotational axis by rotating the windmill through the supply of the driving-gas from at least one of the first driving-gas supplier and the second driving-gas supplier under a control of the driving-gas controller, and wherein the at least one of the first driving-gas supplier and the second driving-gas supplier supplies the driving-gas while the rotation of the injector is stopped by two pins near the holder.

2. The substrate processing apparatus of claim 1, wherein the driving-gas controller is configured to control alternately supplying the driving-gas from the first driving-gas supplier and supplying the driving-gas from the second driving-gas supplier.

3. The substrate processing apparatus of claim 1, wherein the driving-gas controller is configured to control alternately: increasing a flow rate of the driving-gas supplied from the second driving-gas supplier to be more than a flow rate of the driving-gas supplied from the first driving-gas supplier; and increasing the flow rate of the driving-gas supplied from the first driving-gas supplier to be more than the flow rate of the driving-gas supplied from the second driving-gas supplier.

4. The substrate processing apparatus of claim 2, further comprising:

a manifold configured to support the processing container, wherein the holder is attached to the manifold, the holder has a protrusion provided on an outer circumference, the manifold is provided with the two pins formed near the holder, the rotation of the injector in the first direction is performed until the protrusion of the holder comes into contact with a first pin of the two pins, and the rotation of the injector in the second direction is performed until the protrusion of the holder comes into contact with a second pin of the two pins.

5. A substrate processing method of rotating an injector about a longitudinal direction corresponding to a rotational axis by rotating a windmill in a substrate processing apparatus, wherein the substrate processing apparatus includes: a processing container; the injector provided inside the processing container and having a shape extending in the longitudinal direction, the injector configured to supply a processing gas; a holder fixed to the injector; the windmill fixed to the holder; a first driving-gas supplier configured to supply a driving-gas that rotates the windmill in a first direction; a second driving-gas supplier configured to supply the driving-gas that rotates the windmill in a second direction opposite the first direction; and a driving-gas controller configured to control the supply of the driving-gas from the first driving-gas supplier and the second driving-gas supplier, the windmill is rotated through the supply of the driving-gas from at least one of the first driving-gas supplier and the second driving-gas supplier under a control of the driving-gas controller, and the method comprises:

alternately performing, in a state in which the processing gas is supplied into the processing container from the injector, processes of:

rotating the injector in the first direction by supplying the driving-gas to the windmill from the first driving-gas supplier;

rotating the injector in the second direction by supplying the driving-gas to the windmill from the second driving-gas supplier; and supplying the driving gas from the at least one of the first driving-gas supplier and the second driving-gas supplier while the rotation of the injector is stopped by two pins near the holder.

6. A substrate processing method of rotating an injector about a longitudinal direction corresponding to a rotational axis by rotating a windmill in a substrate processing apparatus, wherein the substrate processing apparatus includes: a processing container; the injector provided inside the processing container and having a shape extending in the longitudinal direction, the injector configured to supply a processing gas; a holder fixed to the injector; the windmill fixed to the holder; a first driving-gas supplier configured to supply a driving-gas that rotates the windmill in a first direction; a second driving-gas supplier configured to supply the driving-gas that rotates the windmill in a second direction opposite the first direction; and a driving gas controller configured to control the supply of the driving-gas from the first driving-gas supplier and the second driving-gas supplier, the windmill is rotated through the supply of the driving-gas from at least one of the first driving-gas supplier and the second driving-gas supplier under a control of the driving-gas controller, and the method comprises:

alternately performing, in a state in which the processing gas is supplied from the injector into the processing container and the driving-gas is supplied from the first driving-gas supplier and the second driving-gas supplier, processes of:

rotating the injector in the first direction by increasing a flow rate of the driving-gas supplied from the first driving-gas supplier to be more than a flow rate of the driving-gas supplied from the second driving-gas supplier;

rotating the injector in the second direction by increasing the flow rate of the driving-gas supplied from the second driving-gas supplier to be more than the flow rate of the driving-gas supplied from the first driving-gas supplier; and supplying the driving gas from the at least one of the first driving-gas supplier and the second driving-gas supplier while the rotation of the injector is stopped by two pins near the holder.

* * * * *